United States Patent
Dargis et al.

(10) Patent No.: US 9,139,934 B2
(45) Date of Patent: Sep. 22, 2015

(54) REN SEMICONDUCTOR LAYER EPITAXIALLY GROWN ON REAlN/REO BUFFER ON SI SUBSTRATE

(71) Applicants: Rytis Dargis, Fremont, CA (US); Robin Smith, Palo Alto, CA (US); Andrew Clark, Los Altos, CA (US)

(72) Inventors: Rytis Dargis, Fremont, CA (US); Robin Smith, Palo Alto, CA (US); Andrew Clark, Los Altos, CA (US)

(73) Assignee: TRANSLUCENT, INC., Palo Alto, CA (US)

( * ) Notice: Subject to any disclaimer, the term of this patent is extended or adjusted under 35 U.S.C. 154(b) by 39 days.

(21) Appl. No.: 14/161,925

(22) Filed: Jan. 23, 2014

(65) Prior Publication Data

US 2015/0203990 A1    Jul. 23, 2015

(51) Int. Cl.
| | | |
|---|---|---|
| *H01L 31/0256* | (2006.01) | |
| *H01L 21/00* | (2006.01) | |
| *H01L 21/84* | (2006.01) | |
| *H01L 21/20* | (2006.01) | |
| *H01L 21/36* | (2006.01) | |
| *C30B 29/22* | (2006.01) | |
| *C30B 25/18* | (2006.01) | |
| *C30B 29/40* | (2006.01) | |
| *C30B 29/38* | (2006.01) | |
| *H01L 29/20* | (2006.01) | |
| *H01L 21/02* | (2006.01) | |

(52) U.S. Cl.
CPC .............. *C30B 29/22* (2013.01); *C30B 25/183* (2013.01); *C30B 29/38* (2013.01); *C30B 29/403* (2013.01); *H01L 21/02293* (2013.01); *H01L 29/2003* (2013.01)

(58) Field of Classification Search
CPC ..................... H01L 21/02293; H01L 29/2003; C30B 29/22
USPC ....................... 257/76; 438/151, 479
See application file for complete search history.

(56) References Cited

U.S. PATENT DOCUMENTS

| | | | |
|---|---|---|---|
| 2012/0311365 A1* | 12/2012 | Yoneda et al. | 713/324 |
| 2013/0248853 A1* | 9/2013 | Arkun et al. | 257/43 |
| 2015/0069409 A1* | 3/2015 | Dargis et al. | 257/76 |

* cited by examiner

*Primary Examiner* — David S Blum
(74) *Attorney, Agent, or Firm* — Robert A. Parsons; Michael W. Goltry; Parsons & Goltry

(57) ABSTRACT

Rare earth semiconductor and ferromagnetic material epitaxially grown on a silicon substrate includes a buffer of single crystal epitaxial rare earth/aluminum nitride positioned on a single crystal silicon substrate and a single crystal epitaxial rare earth oxide positioned on the single crystal epitaxial aluminum nitride. A layer of single crystal epitaxial semiconductor and ferromagnetic rare earth nitride is positioned on the buffer. A layer of III-V semiconductive material may be optionally positioned on the rare earth nitride layer.

30 Claims, 3 Drawing Sheets

REN SEMICONDUCTOR LAYER EPITAXIALLY GROWN ON REAlN/REO BUFFER ON SI SUBSTRATE

FIELD OF THE INVENTION

This invention relates in general to the growth of semiconductor layers of rare earth nitride (REN) material on a silicon substrate and more specifically to rare earth nitride epitaxial grown on a REAlN/REO buffer on a silicon substrate.

BACKGROUND OF THE INVENTION

It has been found that rare earth nitrides (REN) posses semiconducting and ferromagnetic properties which makes them useful for a large variety of electronic devices. However, there are no free-standing REN substrates. Epitaxial growth on Si is one of the low cost options but the lattice mismatch between Si and REN is several percent (e.g. the mismatch between Si and ErN is a −10.85%). Additionally, the formation of silicide may take place during attempts to grow REN on a Si substrate particularly at the initial stage of the growth.

Also, in the semiconductor industry, it is known that growing a III-N material, such as GaN, on a silicon substrate is difficult due in large part to the large crystal lattice mismatch (−16.9%) and the thermal mismatch (53%) between silicon and GaN. Also, final tinsel stress arises during III-N growth on Silicon and subsequent cooling of the structure. Thus, some type of buffer layer or layers is generally formed on the silicon substrate and the III-N material is grown on the buffer layer.

Generally, the prior art buffer layers, such as an AlN buffer, do not adequately reduce the strain in the silicon substrate or the III-N due to crystal lattice mismatch. In the prior art, various attempts are disclosed for the growth of different devices including III-V materials on silicon and other substrates. An article entitled "Growth of Atomically smooth AlN films with a 5:4 Coincidence Interface" by Shenk et al. in *Materials Science and Engineering* B59 (1999) 84-87, describes a SAW (Surface Acoustic Wave) device on a Si(111) substrate.

It would be highly advantageous, therefore, to remedy the foregoing and other deficiencies inherent in the prior art.

Accordingly, it is an object of the present invention to provide new and improved methods for the growth of single crystal REN material on a silicon substrate.

It is another object of the present invention to provide new and improved methods for the growth of single crystal III-N material on a silicon substrate using an improved buffer.

It is another object of the present invention to provide new and improved methods for the growth of single crystal III-N material on single crystal REN material on a silicon substrate.

It is another object of the present invention to provide new and improved methods for the growth of single crystal REN material on an improved buffer of REAlN/REO on a silicon substrate.

It is another object of the present invention to provide a new and improved buffer of REAlN/REO on a silicon substrate to more closely match the silicon substrate and single crystal REN material.

SUMMARY OF THE INVENTION

The desired objects and aspects of the instant invention are achieved in accordance with a preferred embodiment of rare earth semiconductor and ferromagnetic material epitaxially grown on a silicon substrate. The embodiment includes a buffer of single crystal epitaxial rare earth/aluminum nitride positioned on a single crystal silicon substrate and a single crystal epitaxial rare earth oxide positioned on the single crystal epitaxial rare earth/aluminum nitride. A layer of single crystal epitaxial semiconductor and ferromagnetic rare earth nitride is positioned on the buffer. A layer of III-V semiconductive material may be optionally positioned on the rare earth nitride layer.

The desired objects and aspects of the instant invention are further realized in accordance with a method of growing a rare earth semiconductor and ferromagnetic material on a silicon substrate including the steps of epitaxially growing a layer of single crystal rare earth/aluminum nitride on the silicon substrate and epitaxially growing a layer of single crystal rare earth oxide on the layer of single crystal rare earth/aluminum nitride. The layer of single crystal rare earth/aluminum nitride and the layer of single crystal rare earth oxide form a buffer for the further epitaxial growth of a layer of single crystal REN semiconductor and ferromagnetic material on the single crystal rare earth oxide.

The desired objects and aspects of the instant invention are further realized in accordance with a method of growing a III-V semiconductive material on a silicon substrate including the steps of epitaxially growing a layer of single crystal rare earth/aluminum nitride on the silicon substrate and epitaxially growing a layer of single crystal rare earth oxide on the layer of single crystal rare earth/aluminum nitride. A layer of single crystal REN material is epitaxially grown on the single crystal rare earth oxide. The layer of single crystal rare earth/aluminum nitride, the layer of single crystal rare earth oxide, and the layer of single crystal REN material form a buffer for the further epitaxial growth of a layer of III-V semiconductive material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
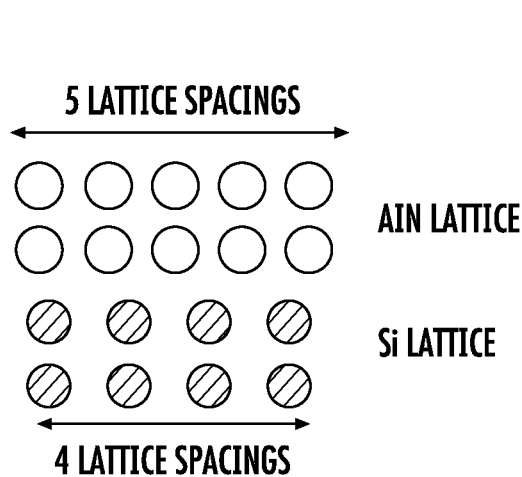
FIG. 1 is a simplified diagram illustrating the approximate crystal lattice match between Si and AlN.

As explained briefly above, prior art buffer layers, such as an AlN buffer, do not adequately reduce the strain in the silicon substrate or the III-N due to crystal lattice mismatch. As illustrated in FIG. 1, a 5:4 lattice co-incidence between AlN and Si has approximately a −1.2% misfit or mismatch leading to a reduced dislocation density. While this mismatch is sufficiently close for some applications, it is desirable when epitaxially growing various semiconductor materials to provide a better crystal matched arrangement so as to substantially eliminate defects in the semiconductor layer.

Figure 2:
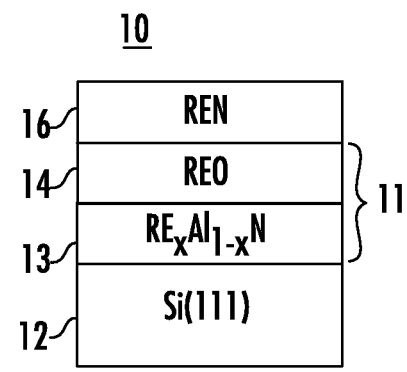
FIG. 2 is a simplified layer diagram illustrating an example of structure and a method of growing REN material on a buffer on a silicon substrate, in accordance with the present invention.

Turning to FIG. 2, a simplified layer diagram is illustrated of a structure 10 representing several steps in a process of growing REN material on a silicon substrate 12, in accordance with the present invention. It will be understood that substrate 12 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates, it will be understood, are not limited to any specific crystal orientation but could include (111) silicon, (110) silicon, (100) silicon, miscuts, or any other orientation or variation known and used in the art. However, throughout this disclosure substrate 12 is illustrated with a preferred (111) orientation because of the simplification of further operations.

In the present invention, as illustrated in FIG. 2, a buffer 11 of single crystal $RE_xAl_{1-x}N$ 13 and single crystal rare earth oxide 14 is epitaxially grown on silicon substrate 12. A layer 16 of rare earth nitride (REN) is grown on rare earth oxide layer 14 of buffer 11. As explained above, the lattice co-incidence between AlN and Si has approximately a −1.2% misfit or mismatch and also has a mismatch with REO layer 14. However, it has been discovered that by mixing smaller amounts of a rare earth metal with the aluminum nitride it has been found that a better match between both silicon substrate 12 and REO layer 14 can be achieved.

Layer 16 of single crystal REN is epitaxially grown on buffer 11. REN has a cubic rock-salt crystal structure which makes it suitable to grow on REO which has a cubic bixbyite crystal structure. Because REO with a cubic bixbyite crystal structure is used, the growth of REN on Si(100), Si(110), Si(111) is possible. As mentioned above, many rare earth nitrides (REN) posses semiconducting and ferromagnetic properties and, thus, the growth of a single crystal layer of REN on a silicon substrate is extremely useful in the semiconductor industry. However, the growth of REN directly on Si is not practical because of the substantial crystal lattice mismatch and because the formation of silicide during the growth process and particularly at the initial stage. Thus, in the present invention multilayer REAlN/REO buffer 11 between silicon substrate 12 and REN semiconducting and ferromagnetic layer 16 is used.

Various rare earth oxides have a crystal lattice spacing that can be substantially matched to the AlN or silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. In this example the lattice mismatch between $Er_2O_3$ and silicon is approximately −2%. The crystal lattice mismatch between the REO layer and the AlN layer is even less. Thus, a mismatch of less than −2% is defined as a "substantial crystallographic match". Further, the crystal lattice spacing of $RE_xAl_{1-x}N$ layer 13 can be varied by varying the composition of the constituents.

Figure 3:
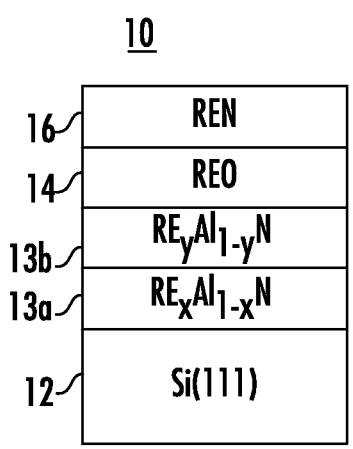
FIGS. 3 and 4 are simplified layer diagrams illustrating the structure of FIG. 2 with a modified buffer, in accordance with the present invention.
Figure 4:
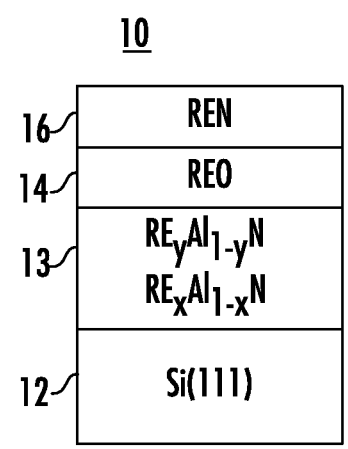

For example, as illustrated in FIG. 3 layer 13 can include multiple layers or sub-layers 13a, 13b, etc. each of which can include different rare earth metals and/or different ratios of rare earth metal and aluminum. In the example illustrated layer 13a includes $RE_xAl_{1-x}N$ and layer 13b includes $RE_yAl_{1-y}N$, where the values of x and y are both between 0 and 1 and y is not equal to x. Also, in FIG. 4 another example is illustrated where the components of a single layer are varied or graded across the single layer from $RE_xAl_{1-x}N$ to $RE_yAl_{1-y}N$, where the values of x and y are both between 0 and 1 and y is not equal to x.

Turning back to FIG. 2, in this invention buffer 11 includes layer 13 of single crystal REAlN and layer 14 of single crystal REO grown epitaxially on layer 13. The formation of REAlN layer 13 between silicon substrate 12 and REO layer 14 prevents the formation of rare earth silicide during subsequent high temperature process steps. Thus, REAlN layer 13 improves the chemical stability of structure 10.

Figure 6:
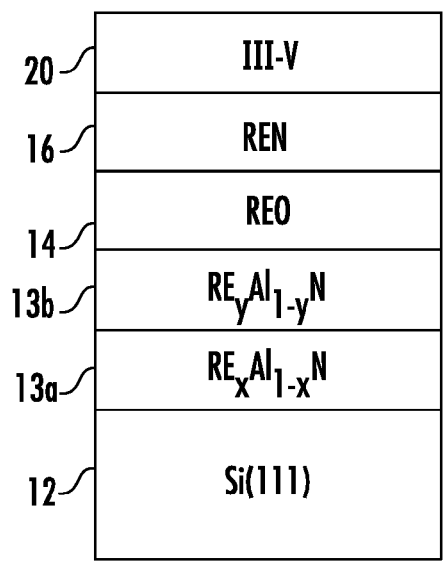
FIGS. 6 and 7 are simplified layer diagrams illustrating III-V material epitaxially grown on the modified buffers of FIGS. 3 and 4, in accordance with the present invention.
Figure 7:
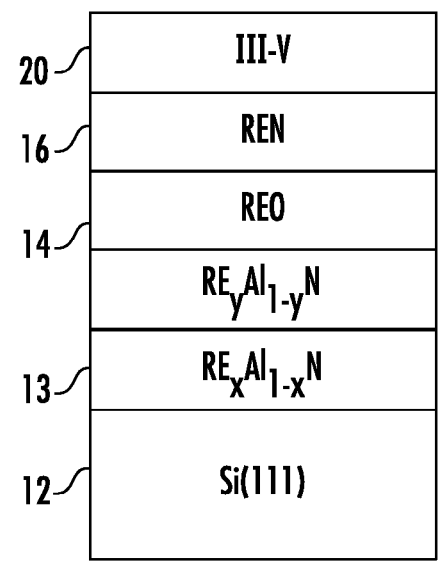

The invention further contemplates the growth of III-N material on silicon substrate 12 (see FIGS. 5-7 and explanation below). Silicon has a cubic crystal orientation and many other III-N materials, such as GaN, have a hexagonal crystal orientation. Epitaxially growing hexagonal crystals onto cubic crystals will generally generate huge lattice mismatch and a large dislocation density or crystal defects which will limit the usefulness of the material for device design. Also, final tinsel stress arises during III-N growth on silicon and subsequent cooling of the structure. Further, because of the mismatch and subsequent dislocation density or defects, the thickness of a layer of III-N material is severely limited since the defects expand as the thickness becomes greater. Thus, it is difficult to grow single crystal GaN onto a single crystal silicon substrate since the different crystals of the two materials are difficult or impossible to lattice match.

In addition to layer 16 of REN possessing semiconducting and ferromagnetic properties and, thus, extremely useful as a final product, structure 10 can be used as a buffer for growth of III-V (e.g. GaN, AlN) semiconductor layers used in, for example, photonic devices. Referring to FIG. 5, a layer 20 of III-V material is epitaxially grown on structure 10 of FIG. 1. As an example, a III-V LED structure could be formed in/on layer 20. Layer 20 is illustrated as a single layer for convenience but it should be understood that the III-V LED structure could include the growth of one or more typical layers, including for example, i-GaN, n-GaN, active layers such as InGaN/GaN, electron blocking layers, p-GaN, and other inter-layers used in the formation and performance of LED (especially photonic LED) devices.

Further, the crystal lattice spacing of $RE_xAl_{1-x}N$ layer 13 can be varied by varying the composition of the constituents so that a closer crystal match is achieved with REN layer 16 and III-V layer 20. For example, as illustrated in FIG. 6 layer 13 can include multiple layers or sub-layers 13a, 13b, etc. each of which can include different rare earth metals and/or different ratios of rare earth metal and aluminum. In the example illustrated layer 13a includes $RE_xAl_{1-x}N$ and layer 13b includes $RE_yAl_{1-y}N$, where the values of x and y are both between 0 and 1 and y is not equal to x. Also, in FIG. 7 another example is illustrated where the components of a single layer are varied or graded across the single layer from $RE_xAl_{1-x}N$ to $RE_yAl_{1-y}N$, where the values of x and y are both between 0 and 1 and y is not equal to x.

Figure 8:
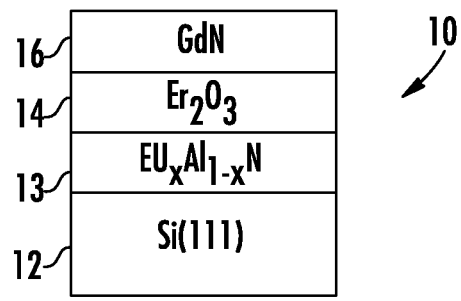
FIGS. 8, 9 and 10 are simplified layer diagrams illustrating specific examples of materials used in the examples illustrated in FIGS. 5-7.

Referring to FIG. 8, structure 10 further is depicted with examples of specific material for each of the layers. In this specific example, europium is the preferred rare earth material mixed with AlN in layer 13 although any rare earth material that crystallizes into a cubic form, such as any of the rare earths with a larger atomic number than gadolinium can be used. Layer 14 of single crystal erbium oxide ($Er_2O_3$) is epitaxially grown on structure 10 preferably by MBE but could instead be grown by MOCVD or any other technique, depending upon the specific application and additional growth techniques utilized. Also, in this specific example GdN is the preferred material for REN layer 16.

Figure 9:
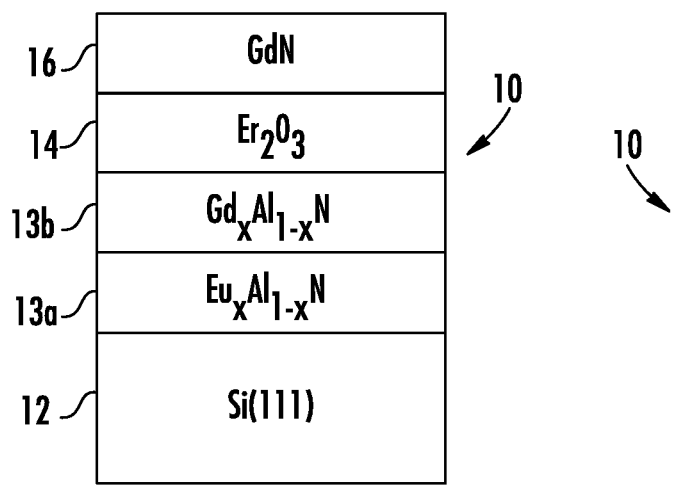
Figure 10:
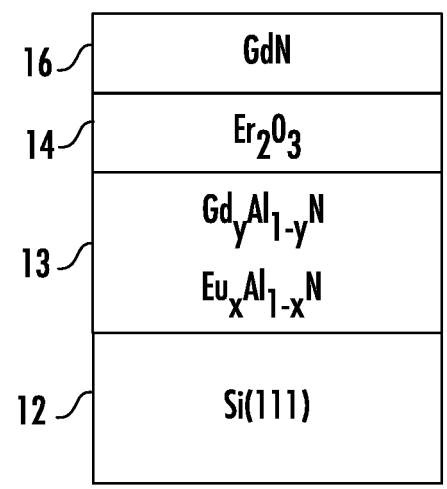

Further, the crystal lattice spacing of $RE_xAl_{1-x}N$ layer 13 can be varied by varying the composition of the constituents so that a closer crystal match is achieved with REN layer 16 and III-V layer 20. For example, as illustrated in FIG. 9 layer 13 can include multiple layers or sub-layers 13a, 13b, etc. each of which can include different rare earth metals and/or different ratios of rare earth metal and aluminum. In the example illustrated, layer 13a includes $Eu_xAl_{1-x}N$ and layer 13b includes $Gd_yAl_{1-y}N$, where the values of x and y are both between 0 and 1 and y is not equal to x. Also, in FIG. 10 another example is illustrated where the components of a single layer are varied or graded across the single layer from $Eu_xAl_{1-x}N$ to $Gd_yAl_{1-y}N$, where the values of x and y are both between 0 and 1 and y is not equal to x.

Figure 5:
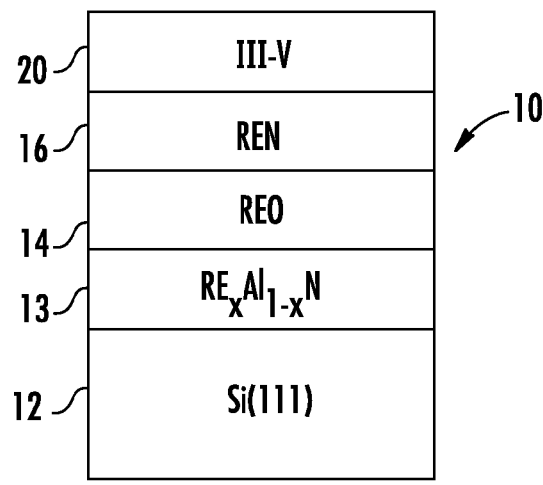
FIG. 5 is a simplified layer diagram illustrating the structure of FIG. 2 with III-V material epitaxially grown thereon, in accordance with the present invention.

As a typical example and referring to FIG. 5, single crystal erbium nitride (ErN) has a cubic crystal structure with a lattice mismatch relative to GaN of 4.842%. Using GaN as a specific example of III-V material for this explanation, the GaN has a hexagonal crystal structure. Also, the GaN has a crystal lattice mismatch with the erbium nitride of 3.189%. The resulting total mismatch of the GaN with single crystal erbium nitride in this specific example is −6.9%, which is a substantial advantage over the mismatch of GaN with erbium oxide.

Thus, in the present novel process, layer 13 of single crystal REAlN is first epitaxially grown on silicon substrate 12 and layer 14 of single crystal rare earth oxide is epitaxially grown on layer 13, forming buffer 11. Buffer 11, including layers 13 and 14, allows the further epitaxial growth of single crystal layer 16 of REN material on silicon substrate 12 with substantially reduced stress. Layer 20 of III-V material is grown epitaxially on layer 16 and may be an active semiconductor layer for the formation of various semiconductor devices or additional layers may be epitaxially grown on layer 20. Also, because of the reduced stress, layer 20 can be grown sufficiently thick to form devices therein.

REO layer 14 of buffer 11 also compressively pre-stresses silicon substrate 12 (generally a silicon wafer) before the growth of REN layer 16, so that final tensile stress that normally would arise during the REN and subsequently III-V growth and subsequent cooling of the structure is substantially reduced. It is known that during the growth of III-V material, and especially GaN, on prior art AlN buffers, diffusion of silicon occurs from the silicon substrate through the AlN buffer and into the III-V material. In structure 10, REAlN layer 13 and REO layer 14 stops the diffusion of silicon into III-V layer 20. Thus, buffer 11 substantially reduces stress in silicon substrate 12 and III-V layer 20 as well as stopping the diffusion of silicon into REN layer 16 and/or III-V layer 20.

Here it must be stressed that by epitaxially growing a buffer of REAlN and rare earth oxide on the silicon substrate, the layer of rare earth nitride can be epitaxially grown as a layer of single crystal material. Also, the combination of the two epitaxial layers that form buffer 11 not only reduce stress in the silicon substrate but also reduce stress in the REN layer and the III-V layer and allow the sufficient epitaxial growth (thickness) of the III-V material. Also, it will be understood that there can be a substantial advantage in growing the entire structure 10 in situ without removal from the chamber and in some specific applications using the same rare earth metal reduces the number of changes of material.

As mentioned above, many rare earth nitrides (REN) posses semiconducting and ferromagnetic properties and, thus, the growth of a single crystal layer of REN on a silicon substrate is extremely useful in the semiconductor industry. However, the growth of REN directly on Si is not practical because of the substantial crystal lattice mismatch and because the formation of silicide during the growth process and particularly at the initial stage. Thus, in the present invention a multilayer rare earth/aluminum nitride (REAlN) and rare earth oxide (REO) buffer between a silicon substrate and a REN final semiconducting and ferromagnetic layer is used.

Thus, new and improved methods for the growth of single crystal semiconducting REN and, optionally, subsequent III-V material and new and improved structures grown on a silicon substrate are disclosed. The new and improved methods for the REN material and the III-V material include the growth of a substantially crystal lattice matching single crystal REAlN/REO buffer on the silicon substrate. Also, the buffer eliminates or greatly reduces the problem of diffusion of silicon into the REN and/or the III-V material. Further, new and improved methods for the epitaxial growth of single crystal semiconductor REN material and new and improved structures grown on a silicon substrate are disclosed.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Rare earth semiconductor and ferromagnetic material on a silicon substrate comprising:
    a single crystal silicon substrate;
    a single crystal epitaxial rare earth/aluminum nitride layer positioned on the silicon substrate;
    a single crystal epitaxial rare earth oxide layer positioned on the single crystal epitaxial rare earth/aluminum nitride layer; and
    a single crystal epitaxial semiconductor and ferromagnetic rare earth nitride layer positioned on the single crystal rare earth oxide layer.

2. The rare earth semiconductor and ferromagnetic material on the silicon substrate as claimed in claim 1 wherein the single crystal epitaxial rare earth/aluminum nitride layer includes multiple layers with one of the multiple layers including $RE_xAl_{1-x}N$ and another of the multiple layers including $RE_yAl_{1-y}N$, where both x and y are between 0 and 1 and y is not equal to x.

3. The rare earth semiconductor and ferromagnetic material on the silicon substrate as claimed in claim 2 where in the single crystal epitaxial rare earth/aluminum nitride layer including $RE_xAl_{1-x}N$ the RE is a first rare-earth metal and in the single crystal epitaxial rare earth/aluminum nitride layer including $RE_yAl_{1-y}N$ the RE is a different rare-earth metal.

4. The rare earth semiconductor and ferromagnetic material on the silicon substrate as claimed in claim 3 wherein the single crystal epitaxial rare earth/aluminum nitride layer including $RE_xAl_{1-x}N$ includes $Eu_xAl_{1-x}N$ and the single crystal epitaxial rare earth/aluminum nitride layer including $RE_yAl_{1-y}N$ includes $Gd_yAl_{1-y}N$.

5. The rare earth semiconductor and ferromagnetic material on the silicon substrate as claimed in claim 1 wherein the single crystal epitaxial rare earth/aluminum nitride layer includes multiple materials graded from $RE_xAl_{1-x}N$ adjacent the substrate to $RE_yAl_{1-y}N$ adjacent the single crystal epitaxial rare earth oxide layer, where both x and y are between 0 and 1 and y is not equal to x.

6. The rare earth semiconductor and ferromagnetic material on the silicon substrate as claimed in claim 5 where the $RE_xAl_{1-x}N$ includes a first rare-earth metal and the $RE_yAl_{1-y}N$ includes a different rare-earth metal.

7. The rare earth semiconductor and ferromagnetic material on the silicon substrate as claimed in claim 6 wherein the $RE_xAl_{1-x}N$ includes $Eu_xAl_{1-x}N$ and the $RE_yAl_{1-y}N$ includes $Gd_yAl_{1-y}N$.

8. The rare earth semiconductor and ferromagnetic material on the silicon substrate as claimed in claim 1 wherein the single crystal epitaxial rare earth oxide layer includes a rare earth oxide with a cubic crystal structure.

9. The rare earth semiconductor and ferromagnetic material on the silicon substrate as claimed in claim 8 wherein the single crystal epitaxial rare earth oxide with the cubic crystal structure includes single crystal erbium oxide ($Er_2O_3$).

10. The rare earth semiconductor and ferromagnetic material on the silicon substrate as claimed in claim 1 wherein the single crystal epitaxial rare earth nitride includes a rare earth nitride with a cubic crystal structure.

11. The rare earth semiconductor and ferromagnetic material on the silicon substrate as claimed in claim 10 wherein the single crystal epitaxial rare earth nitride with the cubic crystal structure includes single crystal gadolinium nitride (GdN).

12. The rare earth semiconductor and ferromagnetic material on the silicon substrate as claimed in claim 1 further including a layer of single crystal epitaxial III-N semiconductor material deposited on the single crystal epitaxial semiconductor and ferromagnetic rare earth nitride layer.

13. The rare earth semiconductor and ferromagnetic material on the silicon substrate as claimed in claim 12 wherein the single crystal epitaxial III-N semiconductor material includes single crystal epitaxial GaN.

14. III-V semiconductive material on a silicon substrate comprising:
  a single crystal silicon substrate;
  a layer of single crystal epitaxial rare earth/aluminum nitride positioned on the silicon substrate;
  a layer of single crystal epitaxial rare earth oxide positioned on the layer of single crystal rare earth/aluminum nitride;
  a layer of single crystal epitaxial rare earth nitride positioned on the layer of single crystal rare earth oxide; and
  a layer of single crystal epitaxial III-V semiconducting material positioned on the layer of single crystal rare earth nitride.

15. The III-V material on the silicon substrate as claimed in claim 14 further including a photonic device formed in/on the layer of single crystal epitaxial III-V semiconducting material.

16. A method of growing rare earth semiconductor and ferromagnetic material on a silicon substrate comprising the steps of:
  providing a single crystal silicon substrate;
  epitaxially growing a layer of single crystal rare earth/aluminum nitride on the silicon substrate;
  epitaxially growing a layer of single crystal rare earth oxide on the layer of single crystal rare earth/aluminum nitride; and
  epitaxially growing a layer of single crystal REN semiconductor and ferromagnetic material on the single crystal rare earth oxide.

17. The method as claimed in claim 16 wherein the step of epitaxially growing the layer of single crystal epitaxial rare earth/aluminum nitride includes epitaxially growing multiple layers with one of the multiple layers including $RE_xAl_{1-x}N$ and another of the multiple layers including $RE_yAl_{1-y}N$, where both x and y are between 0 and 1 and y is not equal to x.

18. The method as claimed in claim 17 where in the step of growing one of the multiple layers including $RE_xAl_{1-x}N$ the RE is a first rare-earth metal and in the step of growing another of the multiple layers including $RE_yAl_{1-y}N$ the RE is a different rare-earth metal.

19. The method as claimed in claim 18 where in the step of growing one of the multiple layers the $RE_xAl_{1-x}N$ is $Eu_xAl_{1-x}N$ and in the step of growing another of the multiple layers the $RE_yAl_{1-y}N$ is $Gd_yAl_{1-y}N$.

20. The method as claimed in claim 16 wherein the step of epitaxially growing the layer of single crystal epitaxial rare earth/aluminum nitride includes epitaxially growing multiple materials graded from $RE_xAl_{1-x}N$ adjacent the substrate to $RE_yAl_{1-y}N$ adjacent the single crystal epitaxial rare earth oxide layer, where both x and y are between 0 and 1 and y is not equal to x.

21. The method as claimed in claim 20 where the $RE_xAl_{1-x}N$ includes a first rare-earth metal and the $RE_yAl_{1-y}N$ includes a different rare-earth metal.

22. The method as claimed in claim 21 wherein the $RE_xAl_{1-x}N$ includes $Eu_xAl_{1-x}N$ and the $RE_yAl_{1-y}N$ includes $Gd_yAl_{1-y}N$.

23. The method as claimed in claim 16 wherein the step of epitaxially growing the single crystal rare earth oxide includes selecting a rare earth oxide with a cubic crystal structure.

24. The method as claimed in claim 23 wherein the step of epitaxially growing the single crystal rare earth oxide with the cubic crystal structure includes epitaxially growing single crystal erbium oxide ($Er_2O_3$).

25. The method as claimed in claim 16 wherein the step of epitaxially growing the single crystal rare earth nitride includes selecting a rare earth nitride with a cubic crystal structure.

26. The method as claimed in claim 25 wherein the step of epitaxially growing the single crystal rare earth nitride with the cubic crystal structure includes epitaxially growing single crystal erbium nitride (GdN).

27. The method as claimed in claim 16 further including a step of epitaxially growing a layer of single crystal III-V semiconducting material on the layer of rare earth nitride.

28. The method as claimed in claim 27 wherein the step of epitaxially growing the layer of single crystal III-V semiconducting material includes epitaxially growing GaN.

29. A method of growing III-V semiconducting material on a silicon substrate comprising the steps of:
  providing a single crystal silicon substrate;
  epitaxially growing a layer of single crystal rare earth/aluminum nitride on the silicon substrate;
  epitaxially growing a layer of single crystal rare earth oxide on the layer of single crystal rare earth/aluminum nitride;
  epitaxially growing a layer of single crystal rare earth nitride on the layer of single crystal rare earth oxide; and
  epitaxially growing a layer of single crystal III-V semiconductive material on the layer of single crystal rare earth nitride.

30. The method as claimed in claim 29 wherein the step of epitaxially growing the layer of single crystal III-V semiconducting material includes epitaxially growing GaN.

* * * * *